US011701653B2

(12) United States Patent
Gerasopoulos et al.

(10) Patent No.: US 11,701,653 B2
(45) Date of Patent: Jul. 18, 2023

(54) MICROFLUIDIC DEVICE WITH LOCALIZED TEMPERATURE CONTROL

(71) Applicant: The Johns Hopkins University, Baltimore, MD (US)

(72) Inventors: Konstantinos Gerasopoulos, Odenton, MD (US); Rama Venkatasubramanian, Cary, NC (US); Mekbib Astatke, Gaithersburg, MD (US)

(73) Assignee: The Johns Hopkins University, Baltimore, MD (US)

( * ) Notice: Subject to any disclaimer, the term of this patent is extended or adjusted under 35 U.S.C. 154(b) by 540 days.

(21) Appl. No.: 16/162,770

(22) Filed: Oct. 17, 2018

(65) Prior Publication Data

US 2019/0111427 A1 Apr. 18, 2019

Related U.S. Application Data

(60) Provisional application No. 62/573,735, filed on Oct. 18, 2017.

(51) Int. Cl.
*B01L 3/00* (2006.01)
*G01N 21/71* (2006.01)
(Continued)

(52) U.S. Cl.
CPC ..... *B01L 3/502715* (2013.01); *B01L 3/50273* (2013.01); *B01L 3/502792* (2013.01);
(Continued)

(58) Field of Classification Search
CPC .......... B01L 3/502715; B01L 3/50273; B01L 3/502792; B01L 7/525; B01L 2300/025;
(Continued)

(56) References Cited

U.S. PATENT DOCUMENTS

| | | |
|---|---|---|
| 10,903,139 B2 | 1/2021 | Venkatasubramanian et al. |
| 2005/0213301 A1* | 9/2005 | Prasher .................. H01L 23/38 257/E23.098 |
| 2018/0138106 A1 | 5/2018 | Venkatasubramanian et al. |

OTHER PUBLICATIONS

Sahu, Vivek, Yogendra K. Joshi, and Andrei G. Fedorov. "Experimental investigation of hotspot removal using superlattice cooler." 2010 12th IEEE Intersociety Conference on Thermal and Thermomechanical Phenomena in Electronic Systems. IEEE, 2010. (Year: 2010).*

(Continued)

*Primary Examiner* — Robert J Eom
(74) *Attorney, Agent, or Firm* — Sung T. Kim

(57) ABSTRACT

A microfluidic apparatus is provided that includes a thermoelectrically-activated pixel array, a microfluidic chip, and control circuitry. The pixel array may include a plurality of thermal pixels, with each thermal pixel including a thermoelectric device. The microfluidic chip may include a microfluidic channel disposed adjacent to the thermal pixels such that thermal energy generated by the thermal pixels is received by the microfluidic channel to form a localized spot within the microfluidic channel corresponding to each thermal pixel. The control circuitry may be electrically coupled to each of the thermal pixels and configured to control the thermal energy being generated by each thermal pixel to control a temperature at each localized spot within the microfluidic channel.

17 Claims, 15 Drawing Sheets

(51) Int. Cl.
*B01L 7/00* (2006.01)
*G01N 15/14* (2006.01)
*H10N 10/17* (2023.01)

(52) U.S. Cl.
CPC ............ *B01L 7/525* (2013.01); *G01N 15/147* (2013.01); *G01N 15/1484* (2013.01); *G01N 21/71* (2013.01); *H10N 10/17* (2023.02); *B01L 2300/025* (2013.01); *B01L 2300/0627* (2013.01); *B01L 2300/0816* (2013.01); *B01L 2300/0861* (2013.01); *B01L 2300/12* (2013.01); *B01L 2300/1822* (2013.01)

(58) Field of Classification Search
CPC ..... B01L 2300/0627; B01L 2300/0816; B01L 2300/0861; B01L 2300/12; B01L 2300/1822; G01N 15/1484; G01N 15/147; G01N 21/71; H01L 35/32
See application file for complete search history.

(56) References Cited

OTHER PUBLICATIONS

Amasia, Mary, Meghan Cozzens, and Marc J. Madou. "Centrifugal microfluidic platform for rapid PCR amplification using integrated thermoelectric heating and ice-valving." Sensors and Actuators B: Chemical 161.1 (2012): 1191-1197. (Year: 2012).*
Marlow, Technical Data Sheet for XLT2422, www.marlow.com, DOC #102-0322 Rev L, p. 1-2.*
Marlow, Technical Data Sheet for NL2064T, www.marlow.com, DOC #102-0345 Rev F, p. 1-2.*
Bulman, Gary, et al. "Superlattice-based thin-film thermoelectric modules with high cooling fluxes." Nature communications 7.1 (2016): 1-7. (Year: 2016).*
Neumann, C., et al. "Design and characterization of a platform for thermal actuation of up to 588 microfluidic valves." Microfluidics and nanofluidics 14.1 (2013): 177-186. (Year: 2013).*
Yang, Ke, et al. "Novel developments in mobile sensing based on the integration of microfluidic devices and smartphones." Lab on a Chip 16.6 (2016): 943-958. (Year: 2016).*

* cited by examiner

MICROFLUIDIC DEVICE WITH LOCALIZED TEMPERATURE CONTROL

CROSS-REFERENCE TO RELATED APPLICATIONS

This application claims the benefit of U.S. Provisional Application No. 62/573,735 filed on Oct. 18, 2017, the entire contents of which are incorporated herein by reference.

TECHNICAL FIELD

Example embodiments generally relate to microfluid technology and, in particular, relate to systems for leveraging temperature control in microfluidic devices.

BACKGROUND

Microfluidic devices have proven to be very useful in a variety of fields including cell biology research, genetics, fluid dynamics, tissue engineering, fertility testing, synthesis of chemicals and proteins, and the like. Such devices leverage the principles of microfluidics, which involves the study of fluids in amounts smaller than a droplet. To form such small amounts, many devices include microfluidic channels having a width that is submicron to a few millimeters. These microfluidic channels may be formed in a device that is referred to as a microfluidic chip. One or more fluids may be provided to an inlet port of the microfluidic channels of a chip to permit processing (e.g., mixing, chemical reactions, physical reactions, or the like) and visualization at the micro-level. In some instances, the microfluidic chip may be operably coupled to a pump that provides a fluid of interest into a microfluidic channel at a given flow rate. The fluid applied to the microfluidic chip may include any type of particles including biologic material, such as proteins and other types of cells, chemicals, or the like. As such, microfluidic chips have been determined to be quite useful in laboratory environments to perform various type of analyses and to visualize samples.

BRIEF SUMMARY OF SOME EXAMPLES

According to some example embodiments, a microfluidic apparatus is provided. The microfluidic apparatus may comprise a thermoelectrically-activated pixel array comprising a plurality of thermal pixels. Each thermal pixel may comprise a thermoelectric device. Further, the microfluidic apparatus may comprise a microfluidic chip. The microfluidic chip may comprise a microfluidic channel. The microfluidic channel may be disposed adjacent to the thermal pixels such that thermal energy generated by the thermal pixels is received by the microfluidic channel to form a localized spot within the microfluidic channel corresponding to each thermal pixel. Additionally, the microfluidic apparatus may also comprise control circuitry electrically coupled to each of the thermal pixels. The control circuitry may be configured to control the thermal energy being generated by each thermal pixel to control a temperature at each localized spot within the microfluidic channel. The control circuitry may be further configured to control a first thermal pixel to generate a first temperature at a first localized spot and control a second thermal pixel to generate a second temperature at a second localized spot, where the first temperature may be different than the second temperature.

According to some example embodiments, a system is also provided. The system may comprise an optical sensor and a microfluidic apparatus. The optical sensor may be configured to capture image data at a microscopic level. In this regard, the optical sensor may be operably coupled to an image data analysis processor, which may be configured to analyze the image data captured by the optical sensor to identify particles or attributes of particles presented in the image data. The microfluidic apparatus may comprise a thermoelectrically-activated pixel array, a microfluidic chip, and control circuitry. The thermoelectrically-activated pixel array may comprise a plurality of thermal pixels, with each thermal pixel comprising a thermoelectric device. The microfluidic chip may comprise a microfluidic channel. The microfluidic channel may be disposed adjacent to the thermal pixels such that thermal energy generated by the thermal pixels is received by the microfluidic channel to form a localized spot within the microfluidic channel corresponding to each thermal pixel. The control circuitry may be electrically coupled to each of the thermal pixels. The control circuitry may be configured to control the thermal energy being generated by each thermal pixel to control a temperature at each localized spot within the microfluidic channel. The control circuitry may be configured to control a first thermal pixel to generate a first temperature at a first localized spot and control a second thermal pixel to generate a second temperature at a second localized spot, where the first temperature is different than the second temperature. Further, the optical sensor may be configured to capture image data at the first localized spot or the second localized spot.

According to some example embodiments, a method is also provided. The method may comprise adding a fluid to a microfluidic channel, and controlling, via control circuitry, a first thermal pixel of a thermoelectrically-activated pixel array to generate a first temperature at a first localized spot within the microfluidic channel. The method may further comprise controlling, via the control circuitry, a second thermal pixel of the thermoelectrically-activated pixel array to generate a second temperature at a second localized spot. The first temperature is different than the second temperature, and the microfluidic channel may be disposed adjacent to the first thermal pixel and the second thermal pixel such that thermal energy generated by the first thermal pixel and the second thermal pixel is received by the fluid in the microfluidic channel.

BRIEF DESCRIPTION OF THE SEVERAL VIEWS OF THE DRAWING(S)

Having thus described some example embodiments in general terms, reference will now be made to the accompanying drawings, which are not necessarily drawn to scale, and wherein:

DETAILED DESCRIPTION

Figure 1:
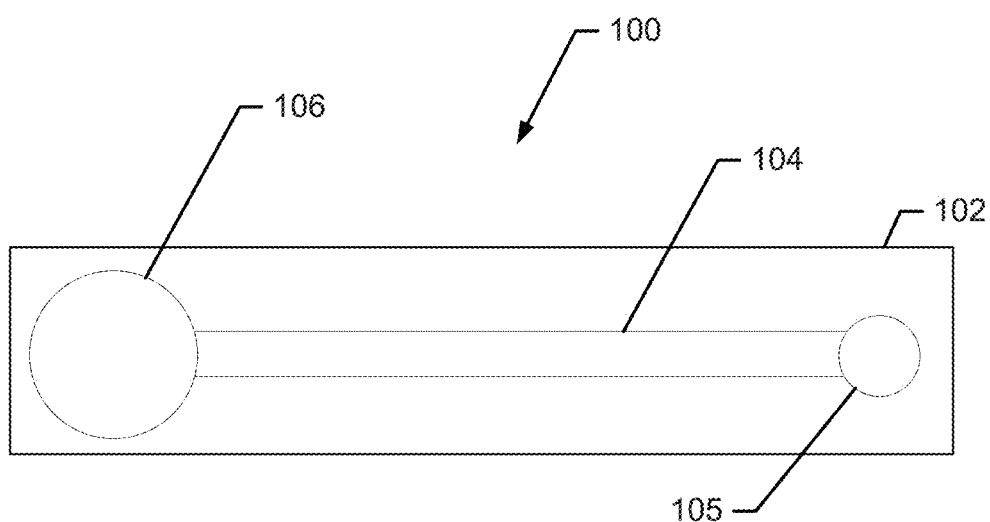
FIG. 1 illustrates an example microfluidic chip according to some example embodiments.

Some example embodiments now will be described more fully hereinafter with reference to the accompanying drawings, in which some, but not all example embodiments are shown. Indeed, the examples described and pictured herein should not be construed as being limiting as to the scope, applicability or configuration of the present disclosure. Rather, these example embodiments are provided so that this disclosure will satisfy applicable legal requirements. Like reference numerals refer to like elements throughout. As used herein, operable coupling should be understood to relate to direct or indirect connection that, in either case, enables functional interconnection of components that are operably coupled to each other.

According to some example embodiments, microfluidic devices are provided that include a thermoelectrically-activated pixel array coupled with a microfluidic chip having at least one microfluidic channel. The thermoelectrically-activated pixel array may comprise a plurality of thermal pixels that can be controlled to either heat or cool a respective localized spot within a microfluidic channel of the chip. Each thermal pixel within the array may be separately and individually controlled by control circuitry to adjust the temperature of a fluid within the channel at the localized spot for a given pixel. As further described below, the ability to generate discrete, temperature-controlled localized areas within the microfluidic channel can offer a variety of benefits and capabilities. Example embodiments may facilitate laboratory testing and studies based on, for example, an ability to isolate certain particles, such as biological material, within a fluid at the localized spot using temperature control. The operation of the microfluidic chip may be refined to, among other things, isolate select particles for visualization. According to some example embodiments, spatiotemporal control within a microfluidic channel may be used to facilitate, for example, the performance of biological analysis processes such as selective capture and release of biological particles and sero-diagnostic techniques for selective pathogen detection.

Further, thermal control, as provided by various example embodiments, in biological applications has proven to be useful for analyzing a variety of biological processes, including cell metabolism and enzyme activity. Conventional solutions have relied upon techniques such as resistive heating to provide the necessary operating temperatures. However, resistive heating techniques can suffer from a lack of temperature and localization control, particularly in cases where fluctuating temperature gradients are desirable, or when high speed temperature cycling is needed. According to some example embodiments, thermoelectric devices in the construction of thermal pixels can be leveraged to overcome this limitation. In this regard, thermoelectric devices may be constructed and operate as miniaturized solid-state heat pumps that can provide both heating and cooling.

Figure 2A:
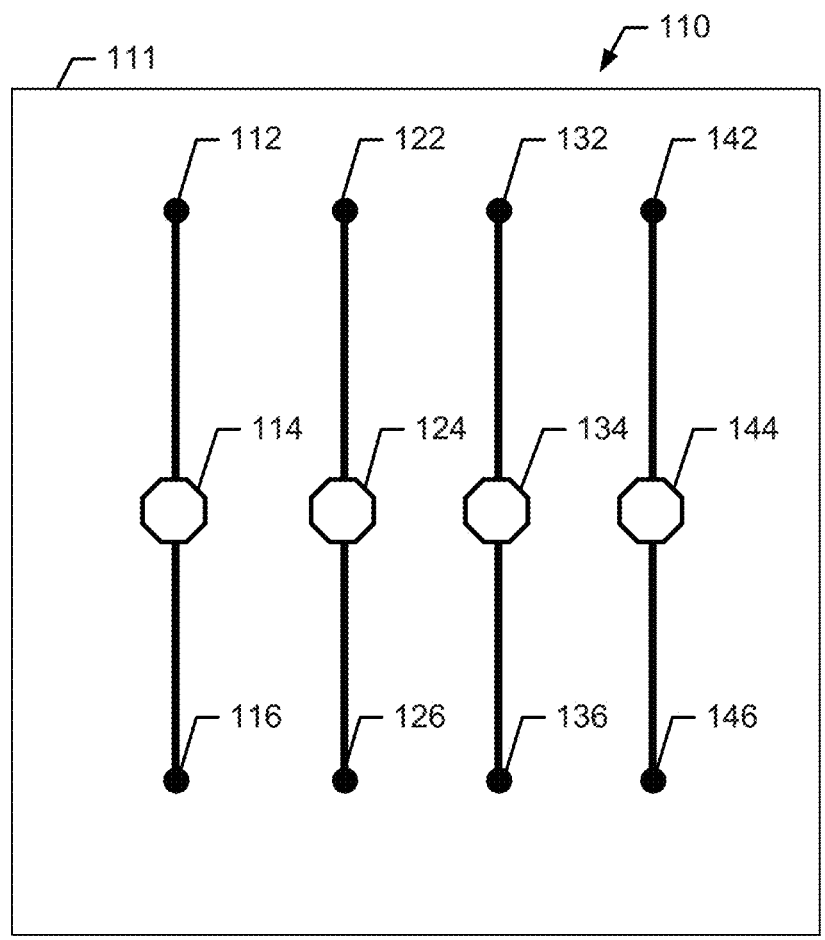
FIG. 2A illustrates an example thermal pixel array according to some example embodiments.
Figure 2B:
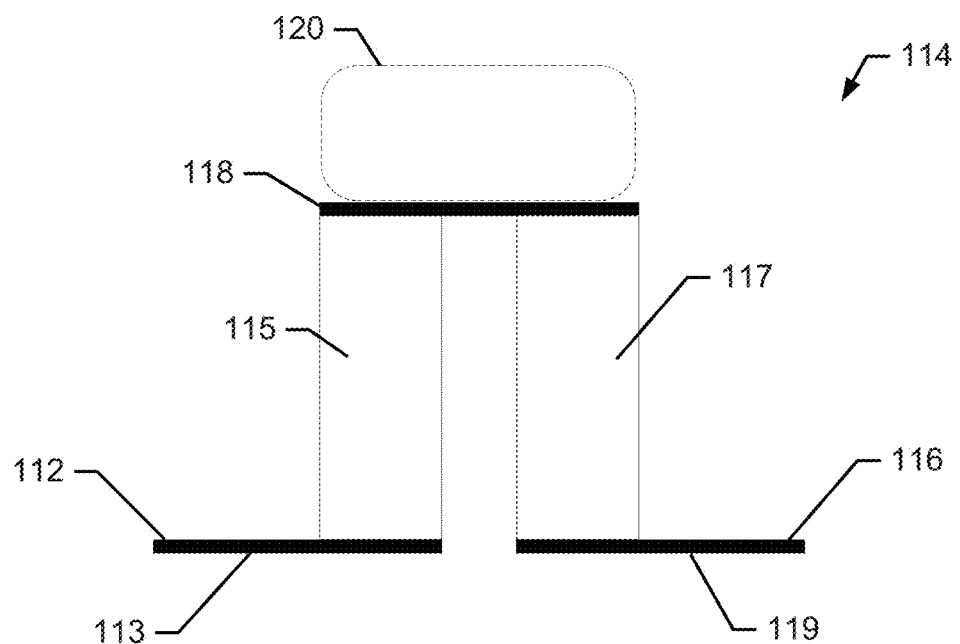
FIG. 2B illustrates an example thermal pixel according to some example embodiments.
Figure 3:
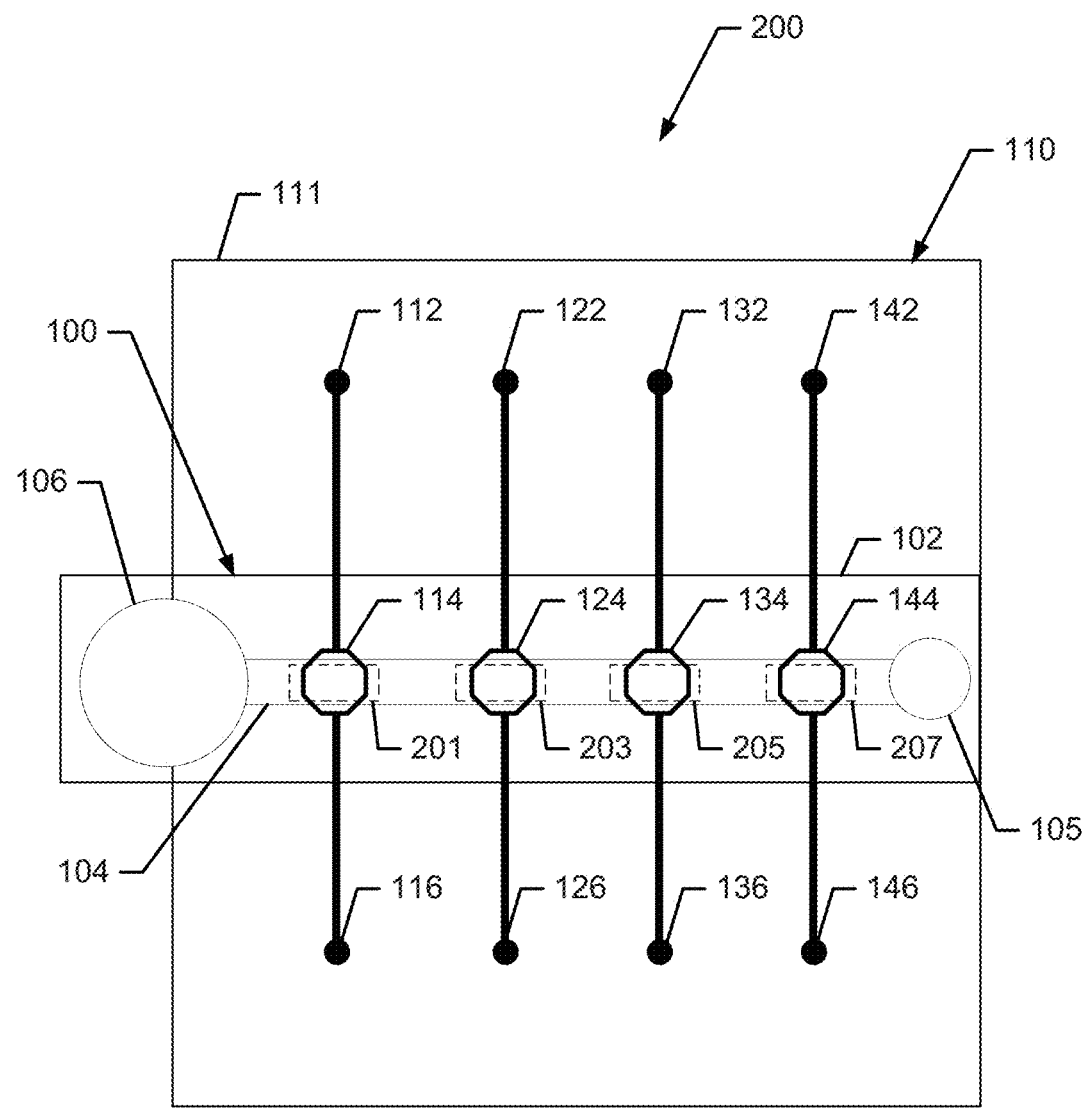
FIG. 3 illustrates an example microfluidic device according to some example embodiments.
Figure 4:
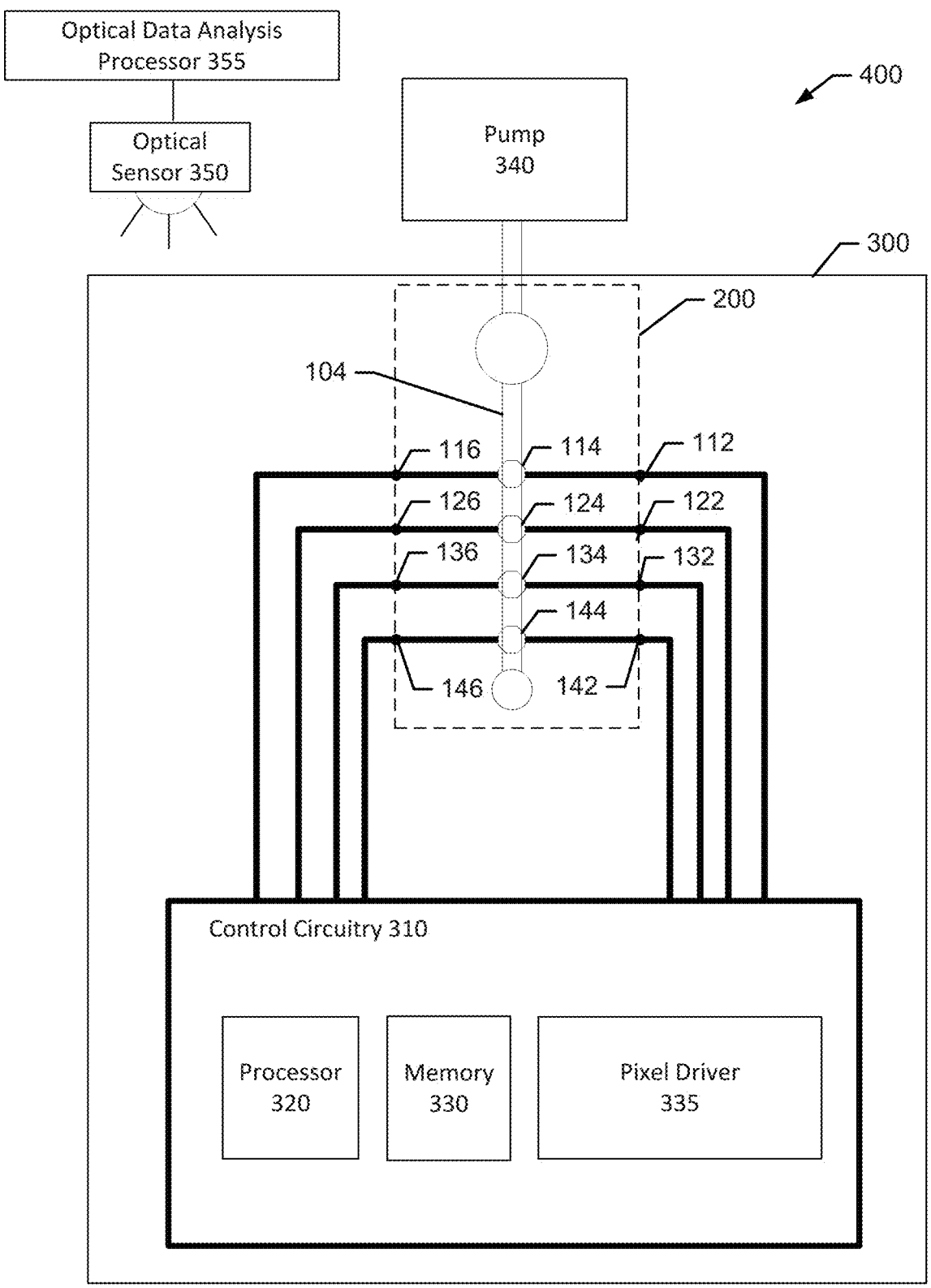
FIG. 4 illustrates an example system and apparatus for localized temperature control in a microfluidic channel according to some example embodiments.

Accordingly, some example embodiments are described as a combination of a microfluidic chip with a thermal pixel array that leverages thermoelectric devices. In this regard, FIGS. 1 through 4 describe some example structures for various components of a microfluidic apparatus. FIG. 1 illustrates an example microfluidic chip 100. FIG. 2A illustrates an example thermal pixel array 110. FIG. 2B illustrates an example thermal pixel 114. FIG. 3 illustrates a microfluidic device 200 formed via the combination of the microfluidic chip 100 and the thermal pixel array 110. FIG. 4 illustrates a microfluidic apparatus 300 and system 400 formed via the combination of the microfluidic chip 100 and the thermal pixel array 110, where the thermal pixel array 110 is electrically coupled to control circuitry 310 to control the heating and cooling of the thermal pixels.

The example microfluidic chip 100 of FIG. 1 is shown as a simple, single channel chip. While the example microfluidic chip 100 is shown to have only a single microfluidic channel 104, it is contemplated that microfluidic chips having more complex systems and patterns of microfluidic channels may also be used in accordance with some example embodiments. Accordingly, the microfluidic chip 100 may have a microfluidic channel 104. The microfluidic channel 104 may be formed as a tunnel or elongated void in the microfluidic chip 100 that may have a width that is submicron to a few millimeters. The microfluidic channel 104 may be formed in a chip substrate 102, which may be formed of, for example, a plastic material. According to some example embodiments, the microfluidic channel 104 may be fabricated by, for example, laser cutting a double-sided medical grade tape and attaching the tape onto a glass slide. A lid, for example, formed of Poly Metha Methyl Acrylate (PMMA) may be attached on top of the laser cut tape to form the microfluidic channel 104. Additionally, the microfluidic chip 100 may include an inlet port 106 and an outlet port 105. The inlet port 106 may provide an input location to facilitate adding a fluid to the microfluidic channel 104. The outlet port 105 may provide an egress for fluid to leave the microfluidic channel 104 if, for example, the fluid is flowing through the microfluidic channel 104.

FIG. 2A illustrates an example thermal pixel array 110, where the pixels are thermoelectrically-activated. The thermal pixel array 110 may be formed on a substrate 111, which, according to some example embodiments, may be an aluminum nitride (AlN) substrate. The substrate 111 may be configured to support a plurality of thermal pixels and associated traces and contacts for controlling the thermal pixels. In the example thermal pixel array 110, four (4) thermal pixels 114, 124, 134, and 144 are disposed on the substrate 111. Traces may be formed on the substrate 111 that electrically connect a contact to a thermoelectric device of each pixel. The traces may be formed of, for example, copper or gold. The contacts for a given thermal pixel may be electrically connected through a pair of thermoelectric devices as further described below. As such, thermal pixel 114 may be electrically connected to contacts 112 and 116. Thermal pixel 124 may be electrically connected to contacts 122 and 126. Thermal pixel 134 may be electrically connected to contacts 132 and 136, and thermal pixel 144 may be electrically connected to contacts 142 and 146. Because the contacts are connected, via the respective traces, to the pixels, the contacts for a given pixel may be used to control the operation of that pixel by applying an electrical bias to the contacts.

FIG. 2B illustrates a structure of the thermal pixel 114, which may be representative of the structures of the other thermal pixels, 124, 134, and 144. In this regard, the thermal pixel 114 may include contact 112 which is connected to thermoelectric device 115 via trace 113 at the base of thermoelectric device 115. The top of thermoelectric device 115 may be connected to the top of thermoelectric device 117 via conductor 118. The base of thermoelectric device 117 may be connected to the contact 116 via the trace 119.

In operation, the thermal pixel 114 may control the temperature in the region 120 above the conductor 118. As further described below, the microfluidic channel 104 may be disposed above the conductor 118 in the region 120, such that a temperature within the microfluidic channel 104 may be controlled at a localized spot above the conductor 118. The temperature within the region 120 may be controlled by providing a select electrical bias or voltage across the contacts 112 and 116, and thus between the thermoelectric devices 115 and 117.

In this regard, the operation of the thermal pixel 114 to heat or cool the region 120 is a result of the operation of the thermoelectric devices 115 and 117. Thermoelectric devices 115 and 117 may be miniaturized solid-state heat pumps that are electrically controlled and can provide both heating and cooling. According to some example embodiments, the thermoelectric devices 115 and 117 may operate according to the Peltier effect to create a temperature difference by transferring heat. The thermoelectric devices 115 and 117 may be formed of one or more P-type and/or N-type junctions. According to some example embodiments, the thermoelectric devices 115 and 117 may be formed as superlattice structures that include many layers of differently doped semiconductors having various thicknesses. Further, according to some example embodiments, the thermoelectric devices 115 and 117 may be formed using bulk semiconductor materials. Alternatively, according to some example embodiments, the thermoelectric devices 115 and 117 may be thin-film thermoelectric devices that, for example, may be formed from nanoscale super-lattice materials. Accordingly, whether based on bulk materials or thin-film construction, the thermal pixel 114 may be formed on a microscale and therefore may be implemented as part of a high-density thermal pixel array. In this regard, for example, while the thermal pixel array 110 is described as including four thermal pixels arranged in a linear fashion, it is contemplated that a larger two-dimensional (e.g., N×M) pixel array could be implemented.

Having described the structure of the thermal pixels 114, 124, 134, and 144, according some example embodiments, the microfluidic chip 100 may be physically coupled to the thermal pixel array 110 to form an example microfluidic device 200 as shown in FIG. 3. The microfluidic chip 100 may be disposed on the thermal pixel array 110 and aligned with the thermal pixels 114, 124, 134, and 144 such that the temperature control offered by the thermal pixels 114, 124, 134, and 144 is received by the microfluidic channel 104.

As shown in FIG. 4, a microfluidic apparatus 300 is provided that includes the device 200 in operable coupling with control circuitry 310. In this regard, the microfluidic apparatus 300 may comprise the microfluidic device 200, which may comprise thermoelectrically-activated pixel array 110. As described above, the array 110 may comprise a plurality of thermal pixels including thermal pixels 114, 124, 134, and 144. Each thermal pixel 114, 124, 134, and 144 may be controllable to increase or decrease a temperature at a localized spot in the microfluidic channel 104 for that thermal pixel. Each thermal pixel 114, 124, 134, and 144 may include a thermoelectric device. The thermoelectric device may be a solid-state semiconductor device. According to some example embodiments, each thermal pixel 114, 124, 134, and 144 may comprise a thin-film thermoelectric device that may, in some examples, comprise super-lattice materials. The microfluidic apparatus 300 may also comprise the microfluidic chip 100 which may include the microfluidic channel 104. The microfluidic channel 104 may be disposed adjacent to, and in some example embodiments, in physical contact with, the thermal pixels 114, 124, 134, and 144 such that thermal energy generated by the thermal pixels 114, 124, 134, and 144 is received by the microfluidic channel 104 to form localized, temperature-controlled spots in the microfluidic channel 104 for each thermal pixel 114, 124, 134, and 144. In some example embodiments, the microfluidic channel 104 may include a thermoresponsive polymer disposed on an interior surface of the microfluidic channel 104, as further described below. Further, in some example embodiments, a fluid, possibly comprising sera or various proteins, may be disposed in the microfluidic channel 104. In some example embodiments, the fluid may comprise, as described in further detail below, first antigens having a first structure and second antigens having a second structure.

The contacts of each of the thermal pixels 114, 124, 134, and 144 may be coupled or connected to control circuitry 310, which may be configured to control the electrical bias or voltage across each thermal pixel 114, 124, 134, and 144 separately and individually. Accordingly, an example microfluidic apparatus 300 is provided where the device 200 is electrically coupled to the control circuitry 310. In this regard, each thermal pixel 114, 124, 134, and 144 may be electrically coupled to the control circuitry 310 via a trace on a substrate, and the control circuitry 310 may also be mechanically coupled to the same substrate. The control circuitry 310 may be electrically connected to contacts 112 and 116 to control thermal pixel 114, contacts 122 and 126 to control thermal pixel 124, contacts 132 and 136 to control thermal pixel 134, and contacts 142 and 146 to control thermal pixel 144. Additionally, the microfluidic channel 104 may be fluidly coupled to a pump 340, which may be configured to generate a fluid flow by applying a fluid pressure to a fluid within the microfluidic channel 104.

According to some example embodiments, the pump 340 and the flow speed provided by the pump 340 may be controlled by control circuitry 310.

The control circuitry 310, of the microfluidic apparatus 300, may be configured to control the voltages applied to the thermal pixels 114, 124, 134, and 144, and thus the temperature at respective localized spots within the microfluidic channel 104 corresponding to the thermal pixels 114, 124, 134, and 144. In this regard, the control circuitry 310 may include, among other components, a processor 320 and a memory 330. The control circuitry 310 may also be in operative communication with or embody a pixel driver 335. The control circuitry 310 may be configurable to perform various operations as described herein.

In some embodiments, the control circuitry 310 may be embodied as a chip or chip set. In other words, the control circuitry 310 may comprise one or more physical packages (e.g., chips) including materials, components, or wires on a structural assembly (e.g., a baseboard). The control circuitry 310 may be configured to receive inputs (e.g., via peripheral components including the memory 330), perform actions based on the inputs, and generate outputs (e.g., for provision to peripheral components). In an example embodiment, the control circuitry 310 may include one or more instances of a processor 320, associated circuitry, and memory 330. As such, the control circuitry 310 may be embodied as a circuit chip (e.g., an integrated circuit chip, such as a field programmable gate array (FPGA)) configured (e.g., with hardware, software or a combination of hardware and software) to perform operations described herein.

In an example embodiment, the memory 330 may include one or more non-transitory memory devices such as, for example, volatile or non-volatile memory that may be either fixed or removable. The memory 330 may be configured to store information, data, applications, instructions or the like for enabling, for example, control sequences for fluid analysis. The memory 330 may also be configured to buffer input data for processing by the control circuitry 310. Additionally or alternatively, the memory 330 could be configured to store instructions for execution by the control circuitry 310. Among the contents of the memory 330, applications may be stored for execution by the control circuitry 310 in order to carry out the functionality associated with each respective application.

As mentioned above, the control circuitry 310 may be embodied in a number of different ways. For example, the control circuitry 310 may be embodied as various processing means such as one or more processors 320 that may be in the form of a microprocessor or other processing element, a coprocessor, a controller or various other computing or processing devices including integrated circuits such as, for example, an ASIC (application specific integrated circuit), an FPGA, or the like. In an example embodiment, the control circuitry 310 may be configured to execute instructions stored in the memory 330 or otherwise accessible to the control circuitry 310. As such, whether configured by hardware or by a combination of hardware and software, the control circuitry 310 may represent an entity (e.g., physically embodied in circuitry—in the form of control circuitry 310) capable of performing operations according to example embodiments while configured accordingly. Thus, for example, when the control circuitry 310 is embodied as an ASIC, FPGA, or the like, the control circuitry 310 may be specifically configured hardware for conducting the operations described herein. Alternatively, as another example, when the control circuitry 310 is embodied as an executor of software instructions, the instructions may specifically configure the control circuitry 310 to perform the operations described herein.

In an example embodiment, the control circuitry 310 may control the microfluidic apparatus 300 to perform various functionalities as described herein, including driving the thermal pixels 114, 124, 134, and 144 of the thermal pixel array 110. As such, in some embodiments, the control circuitry 310 may be said to cause at least some of the operations described in connection with, for example, a method associated with the flowchart 1700 of FIG. 17, and the functionalities otherwise described herein. The control circuitry 310 may therefore undertake the corresponding functionalities responsive to execution of instructions or algorithms configuring the control circuitry 310 accordingly. The control circuitry 310 may provide programmable control signals, selections, and the like to control the operation of the apparatus 300 responsive to execution of instructions stored in the memory 330.

In this regard, via the pixel driver 335, the control circuitry 310 may be configured to control the thermal energy being generated by each thermal pixel 114, 124, 134, and 144 to control a temperature at each localized spot within the microfluidic channel 104. The control circuitry 310 may be configured to control a first thermal pixel to generate or maintain a first temperature at a first localized spot and control a second thermal pixel to generate or maintain a second temperature at a second localized spot. According to some example embodiments, the first temperature may be different than the second temperature. According to some example embodiments, the first localized spot may be adjacent the second localized spot in the microfluidic channel. Further, the control circuitry 310 may be configured to control the first thermal pixel to reduce, raise, or maintain the first temperature at the first localized spot, and control the second thermal pixel to reduce, raise, or maintain the second temperature at the second localized spot. When the first temperature is different from the second temperature, then a temperature gradient may be formed within the microfluidic channel 104 between the first localized spot and the second localized spot. According to some example embodiments, the control circuitry 310 may also be configured to control the first thermal pixel to generate the first temperature at the first localized spot, where the first temperature affects a wettability of a thermoresponsive polymer disposed at the first localized spot as further described below.

Further, a system 400 of FIG. 4 may be defined that includes additional components. In this regard, the system 400 may include an optical sensor 350 controlled by an optical data analysis processor 355. In this regard, the optical sensor 350 may be an imaging device configured to capture images and image data at a microscopic level using a variety of illumination technologies. With the assistance of the optical sensor 350 and an operable coupling thereto, the optical data analysis processor 355 may obtain image data of the various localized spots formed in the microfluidic channel 104 and analyze the image data to identify particles or attributes of particles presented in the image data. In this regard, the optical data analysis processor 355 may be a processing device, similar to processor 320. For example, some example embodiments may be integrated with optical sensing modalities (e.g., the optical data analysis processor 355 and optical sensor 350) to perform analyses, including diagnostic analyses on biologic samples.

Having described some example structures, according to some example embodiments, that can be combined to form the microfluidic device 200, the apparatus 300, and the system 400, further detail with respect to the operational aspects and variations to the structures can be described building on these structures as a foundation. In this regard, as mentioned above, the thermal pixels 114, 124, 134, and 144 may be constructed using bulk materials or via thin-film techniques. While the use of bulk materials in the construction of thermoelectric devices for thermal pixels 114, 124, 134, and 144 offers an effective solution for many applications, according to some example embodiments, thin-film thermoelectric technology may be leveraged to develop high density thermal pixel arrays capable of higher speed, on-demand spot heating and cooling for a broader range of biological applications. Thermal pixels that utilize thin-film thermoelectric devices offer improved performance because the pixel is smaller than a pixel in a bulk implementation. According to some example embodiments, the die size of a thin-film thermal pixel may be 0.6 millimeters. Although thermal pixels leveraging thin-film technology require higher electrical currents due to a lower resistance relative to bulk solutions, thin-film based pixels can offer improved heat pumping capacity relative to bulk embodiments. According to some example embodiments, the heat pumping capacity may be based on a thickness of an active film of the device and thus a thickness may be selected for certain applications based on the heat pumping capacity requirements. Thus, example embodiments where, for example, the thermoelectric devices 115 and 117 of a thermal pixel are constructed using thin-film techniques using, for example, nanoscale superlattice materials, can offer a powerful enabling technology to provide energy-efficient solutions for thermal management at the micro-scale. Also, the die size of the thin-film thermal pixels may be scaled down further by, for example, an order of magnitude or more, thereby allowing for a highly multiplexed platform with multianalyte sensing capabilities in a very small and compact form factor. Such a small scale implementation may provide for capture of individual cells or clusters of cells, in the tens of microns.

Figure 5:
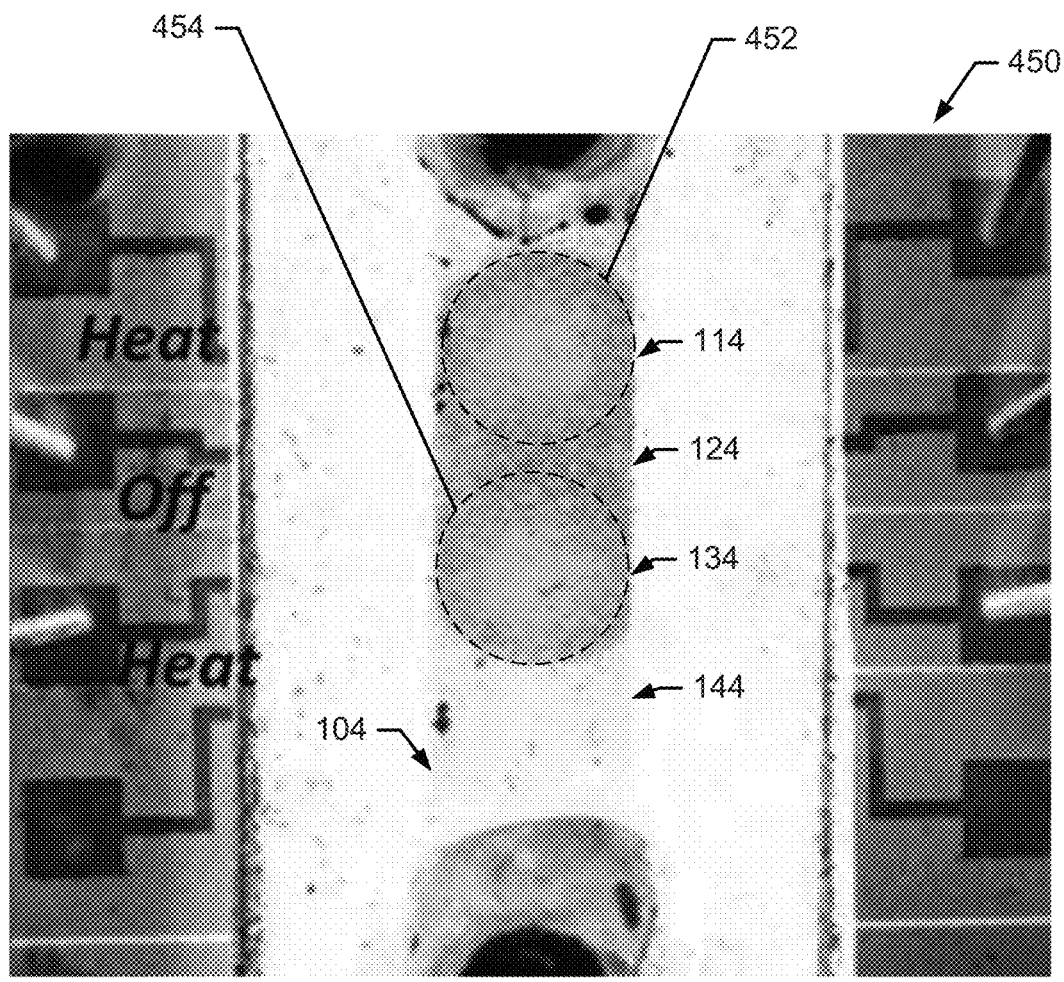
FIG. 5 illustrates an example implementation of a microfluidic apparatus according to some example embodiments.

With reference to FIG. 5, an example implementation 450 of a microfluidic apparatus 300 is provided, where the thermal pixels 114, 124, 134, and 144 are constructed using bulk materials. In the example implementation 450, a water-based, thermoresponsive dye has been input into the microfluidic channel 104. Additionally, the control circuitry 310 is controlling the thermal pixels such that thermal pixel 114 provides heat, thermal pixel 124 is off (i.e., is not providing heating or cooling), thermal pixel 134 provides heat, and thermal pixel 144 is off (i.e., is not providing heating or cooling). The thermal pixels 114, 124, 134, and 144 are not viewable in the image of FIG. 5 because the thermal pixels 114, 124, 134, and 144 are located below the microfluidic channel 104. However, because thermal pixel 114 and thermal pixel 134 are providing heat, the temperature sensitive dye is attracted to and flows towards the higher temperatures, and thus localized spots 452 and 454 are shown in FIG. 5, respectively. Additionally, it can be seen that cooler portions of the dye run together over thermal pixel 124. This is because thermal pixel 124 is off (i.e., not providing heating or cooling), resulting in a smaller temperature gradient between thermal pixel 114 and thermal pixel 124, as well as between thermal pixel 134 and thermal pixel 124, than if the thermal pixel 124 was in a cooling mode, as described with respect to FIGS. 6A and 6B. In other words, because thermal pixel 124 is off, the smaller temperature gradient allows the dye to run together, rather than being completely separated, which may be achieved by increasing the temperature gradient. As such, when the microfluidic apparatus 300 is operated with no thermal pixels in a cooling mode, the localized spots as indicated by the thermoresponsive dye can spread gradually between the localized spots due to, in this implementation 450, the relatively high thermal conductivity of the water-based dye and the low temperature gradient between the localized spots.

Figure 6A:
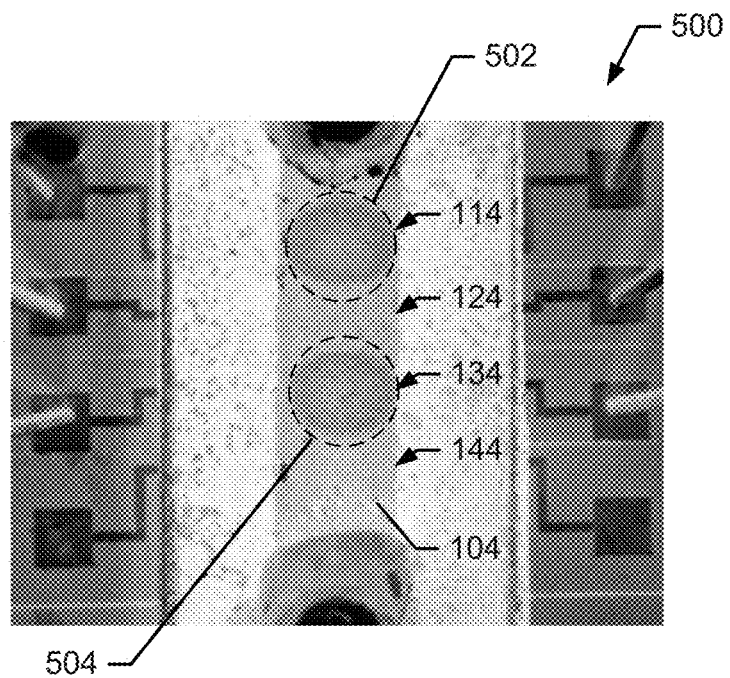
FIGS. 6A and 6B illustrate other example implementations of a microfluidic apparatus according to some example embodiments.

Now referring to FIG. 6A, another example implementation 500 of microfluidic apparatus 300 is provided, where the thermal pixels 114, 124, 134, and 144 are constructed using bulk materials. In the example implementation 500, a water-based, thermoresponsive dye has again been input into the microfluidic channel 104. In implementation 500, the control circuitry 310 is controlling the thermal pixels such that thermal pixel 114 provides heat, thermal pixel 124 is cooling, thermal pixel 134 provides heat, and thermal pixel 144 is cooling. The thermal pixels 114, 124, 134, and 144 are not viewable in the image of FIG. 6A because the thermal pixels 114, 124, 134, and 144 are located below the microfluidic channel 104. However, because thermal pixel 114 and thermal pixel 134 are heating, the temperature sensitive dye shows localized spots 502 and 504, respectively. Additionally, it can be seen that because thermal pixel 124 is now cooling, there is a greater temperature gradient in the microfluidic channel 104 and the dye does not run together and has improved localization. Thus, when a thermal pixel is operated in heating mode, with adjacent thermal pixels in cooling mode, the spots 502 and 504 show improved localization due to the increased temperature gradient. By having adjacent thermal pixels heating and cooling, a "push-pull" configuration is achieved (i.e., pushing heat in one area and pulling heat in another area).

Figure 6B:
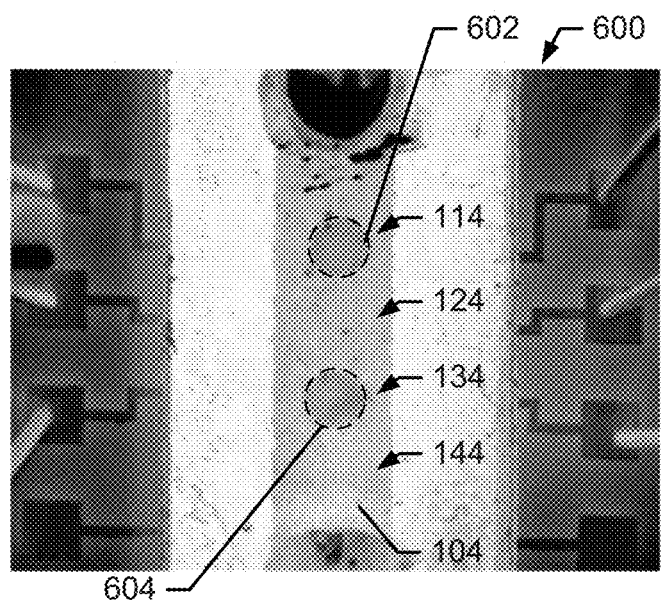

Now referring to FIG. 6B, another example implementation 600 of microfluidic apparatus 300 is provided, where the thermal pixels 114, 124, 134, and 144 are constructed as thin-film devices. In the example implementation 600, a water-based, thermoresponsive dye has again been input into the microfluidic channel 104. In implementation 600, the control circuitry 310 is controlling the thermal pixels such that thermal pixel 114 provides heat, thermal pixel 124 is cooling, thermal pixel 134 provides heat, and thermal pixel 144 is cooling. The thermal pixels 114, 124, 134, and 144 are not viewable in the image of FIG. 6B because the thermal pixels 114, 124, 134, and 144 are located below the microfluidic channel 104. However, because thermal pixel 114 and thermal pixel 134 are heating, the temperature sensitive dye shows localized spots 602 and 604, respectively. Due to the smaller size of the thin-film based thermal pixels and the improved heat pumping capability, it can be seen that the localized spots 602 and 604 are smaller (relative to the bulk implementation 500) and the gap in the dye between spot 602 and spot 604 is larger, leading to a more localized and distinctive result. Additionally, since thermal pixel 124 is cooling, there is a greater temperature gradient in the microfluidic channel 104 and the dye does not run together. This again leverages the push-pull configuration described above.

Figure 7:
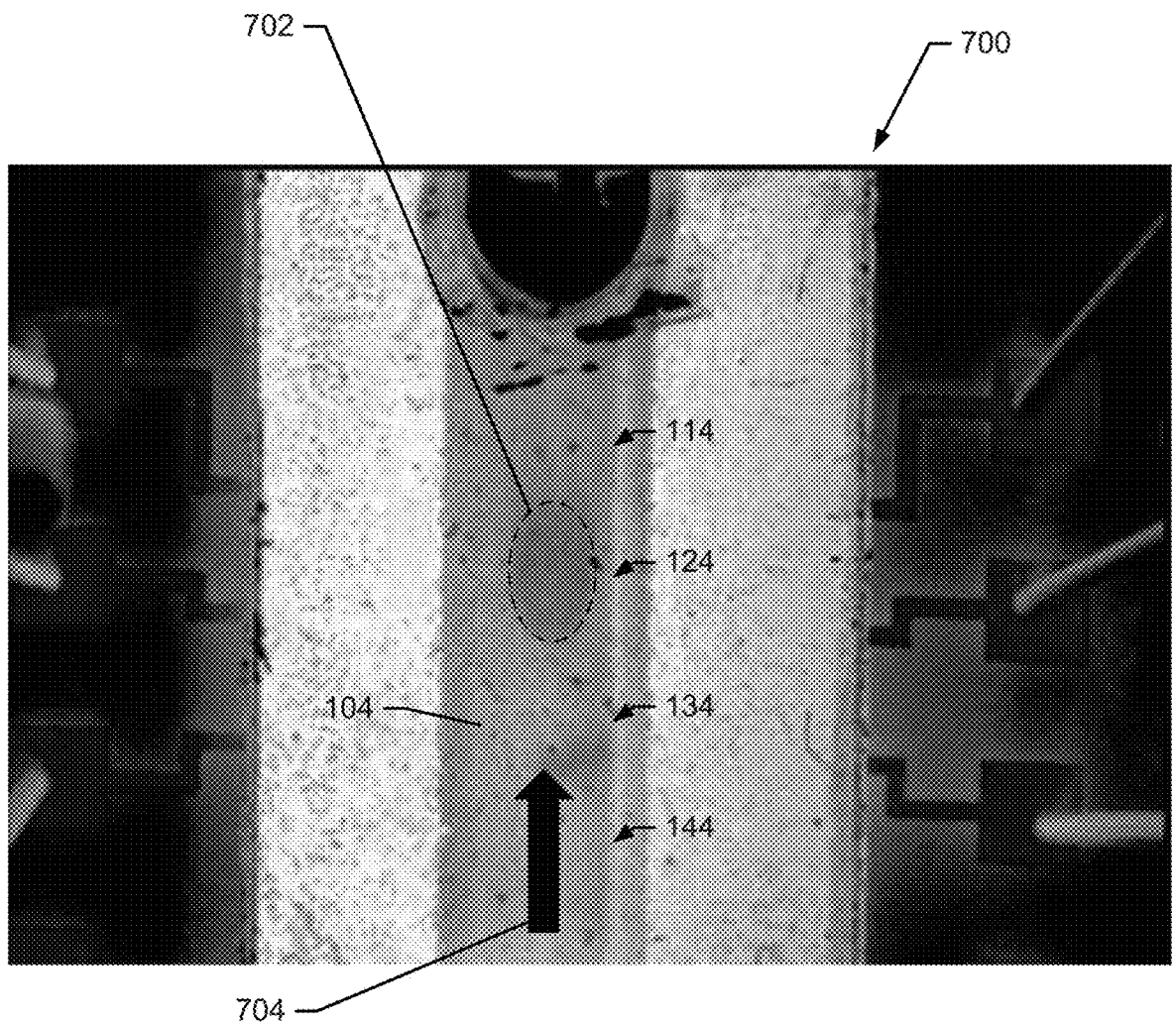
FIG. 7 illustrates another example implementation of a microfluidic apparatus with a microfluidic channel having a fluid flow according to some example embodiments.

Additionally, due to the high localization and heat pumping capacity, thin-film based thermal pixels are also effective when a fluid is flowing in the microfluidic channel 104. With reference to FIG. 7, another example implementation 700 of microfluidic apparatus 300 is provided with the pump 340 or other means creating a flow in the microfluidic channel 104 in the direction of arrow 704. Again, the thermal pixels 114, 124, 134, and 144 are constructed as thin-film devices. In the example implementation 700, a water-based, thermoresponsive dye has again been input into the microfluidic channel 104 and has been subjected to a flow. In implementation 700, the control circuitry 310 is controlling thermal pixel 114 to cool, thermal pixel 124 to heat, thermal pixel 134 to cool, and thermal pixel 144 to cool. The thermal pixels 114, 124, 134, and 144 are not viewable in the image of FIG. 7 because the thermal pixels 114, 124, 134, and 144 are located below the microfluidic channel 104. However, because thermal pixel 124 is heating, the temperature sensitive dye shows localized spot 702. Relative to the spots that were not subjected to a flow (as shown in FIGS. 5, 6A, and 6B), localized spot 702 is elongated in the direction of the flow. As such, the thin-film based thermal pixels can still maintain a temperature gradient under fluid flow.

Figure 8:
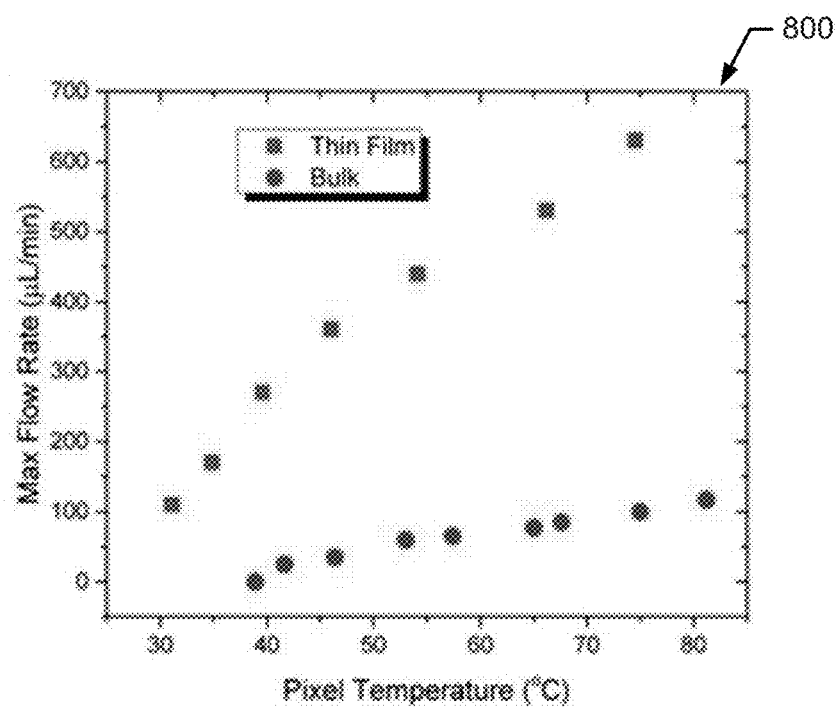
FIG. 8 is a graph of pixel temperature relative to maximum flow rate according to some example embodiments.

In the implementation 700, the temperature provided by thermal pixel 124 was set to a certain value and the flow rate of the thermoresponsive dye solution was gradually increased until the localized spot disappeared. The thermoresponsive dye lower limit was found to be around 30° C. and the input solution temperature is roughly 20-22° C. As such, this implementation 700 shows a temperature gradient greater than approximately 8-10° C. at a specified location. Relative to similar testing performed on an implementation with bulk-based thermal pixels, approximately an 8 to 10 fold improvement in the ability to maintain a localized spot under flow can be realized by the thin-film based thermal pixels relative to the bulk-based thermal pixels. This can be seen in the graph 800 of FIG. 8, which shows plots of the temperature needed at different flow rates to maintain a localized spot. As can be seen, slight increases in flow rate with the bulk implementations require substantially higher temperature values, with higher flow rates not being available for bulk implementations.

Figure 9A:
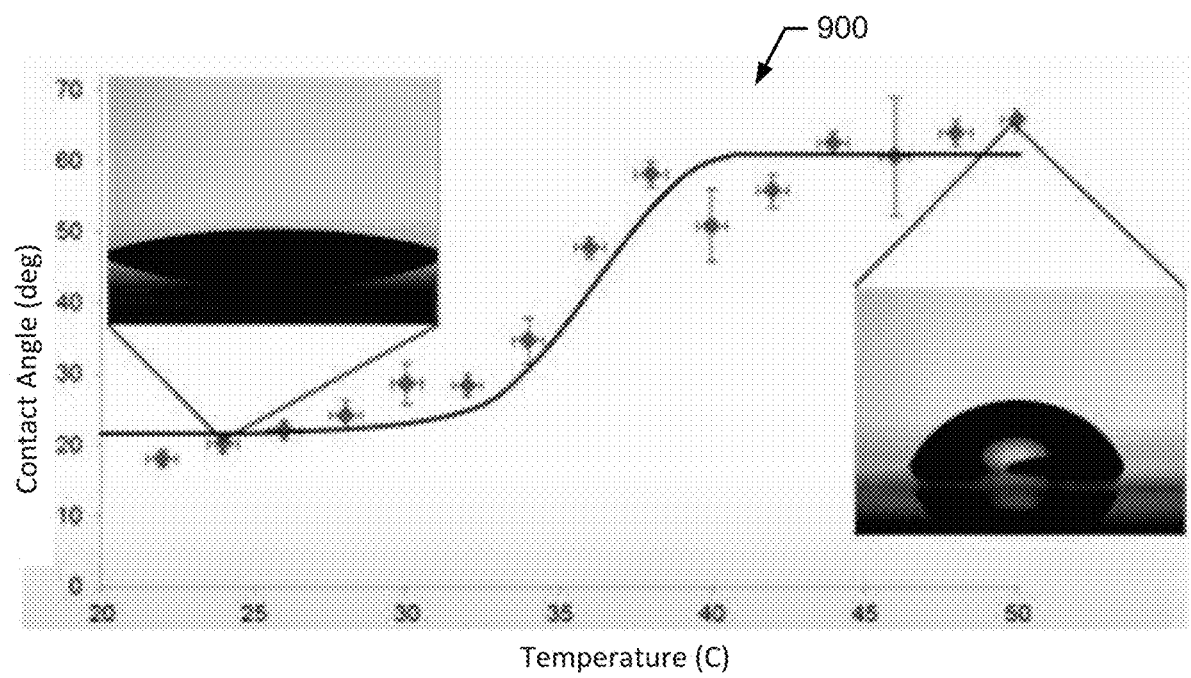
FIG. 9A is a graph of temperature relative to contact angle for a thermoresponsive polymer according to some example embodiments.

Further, to support some biological applications, a thermoresponsive polymer may be applied to an interior surface of the microfluidic channel 104. Referring back to FIG. 3, a thermoresponsive polymer may be applied at the localized spot for each thermal pixel 114, 124, 134, and 144. In this regard, the thermoresponsive polymer may be applied within the microfluidic channel 104 at locations 201, 203, 205, and 207. According to some example embodiments, the use of a thermoresponsive polymer may facilitate the selective capture of biological particles in the microfluidic channel 104. According to some example embodiments, a polyisopropylacrylamide (PNIPAAm) thermoresponsive polymer may be used. A thermoresponsive polymer may change its wettability from hydrophilic to hydrophobic when a temperature of the thermoresponsive polymer is below or above a critical solution temperature (roughly 32° C. for PNIPAAm as indicated in the graph 900 of FIG. 9A). Since biological cells tend to adhere more strongly to hydrophobic surfaces, by controlling the temperature and wettability of the thermoresponsive polymer at the localized spot in the microfluidic channel 104, the attachment of cells within the localized spot can also be controlled. A significantly enhanced particle attachment density can be realized by heating one or more of the thermal pixels 114, 124, 134, and 144, which can prove to be useful to control biologically relevant processes using extremely small thermal pixel sizes. As such, according to some example embodiments, an enhanced fluorescently labelled hydrophobic particle attachment technique is made available through use of a the microfluidic apparatus 300 that utilizes a thermoresponsive polymer.

Figure 9B:
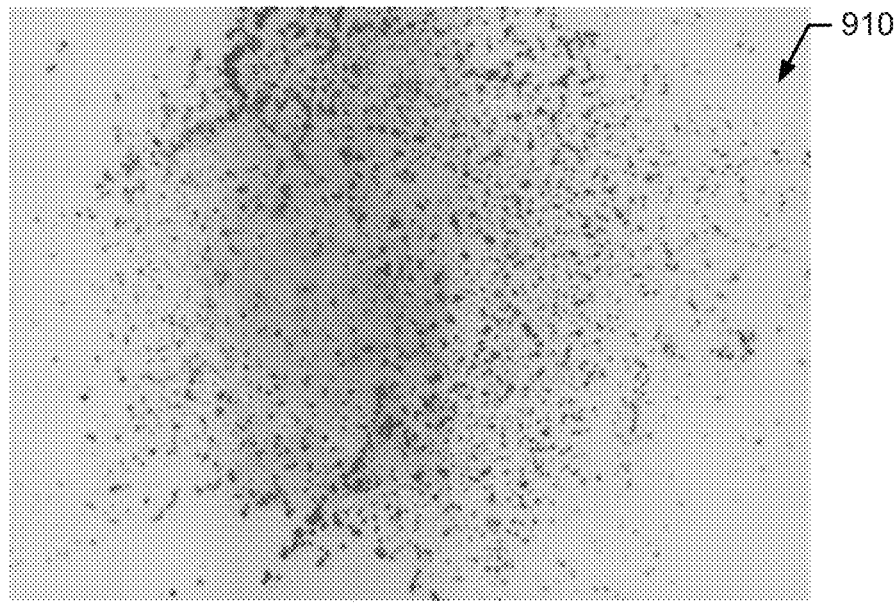
FIG. 9B is an image of particles within a heated microfluidic channel including a thermoresponsive polymer according to some example embodiments.
Figure 9C:
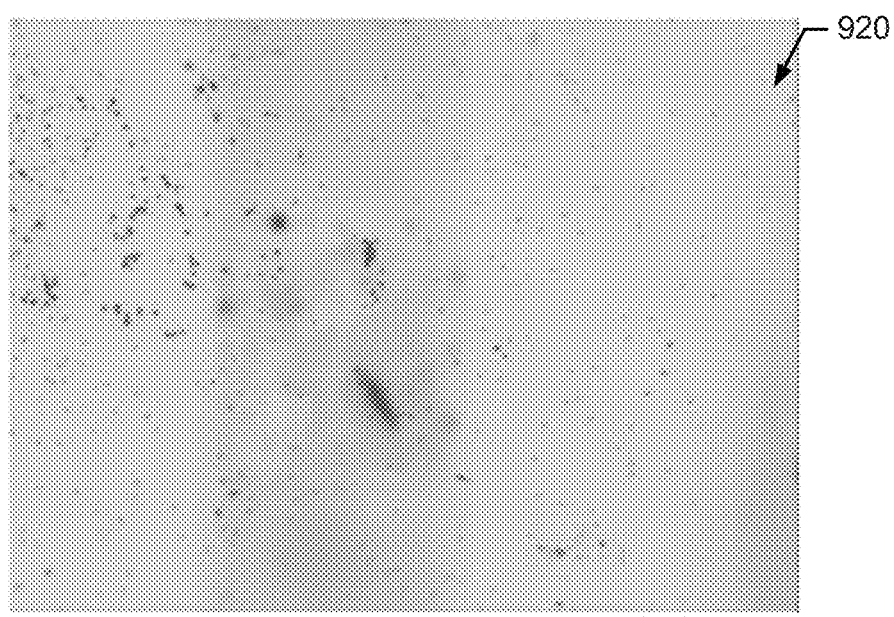
FIG. 9C is an image of particles within an unheated microfluidic channel including a thermoresponsive polymer according to some example embodiments.

FIGS. 9B and 9C show the results of an implementation using a thermoresponsive polymer in a microfluidic channel that is temperature-controlled by a pixel of a thermal pixel array of the microfluidic apparatus 300. In this regard, fluorescent polystyrene particles were used as a surrogate in place of biological particles for testing purposes. In this regard, image 910 of FIG. 9B was taken of a thermoresponsive polymer-treated microfluidic channel with fluorescent polystyrene particles therein, where the microfluidic channel is being heated by a pixel of, for example, microfluidic apparatus 300. The thermoresponsive polymer is PNIPAAm. The heating generated by the pixel renders the PNIPAAm hydrophobic which causes a high density of particles to attach as indicated by the abundance of darkened spots in the image 910. Alternatively, image 920 of FIG. 9C was taken of a thermoresponsive polymer-treated microfluidic channel with fluorescent polystyrene particles therein that is not being heated by a pixel. Again, the thermoresponsive polymer being used is PNIPAAm. Because the pixel is not heating (e.g., the pixel is off), the PNIPAAm is in a hydrophilic state and thus the particles do not attach as shown by the absence of darkened spots in image 920, relative to those appearing in image 910. As such, images 910 and 920 show that heating by a thermal pixel, according to some example embodiments, can be used to control the wettability of the thermoresponsive polymer and thus the attachment of particles within a microfluidic channel. The example microfluidic apparatus 300 may be leveraged for a variety of applications including, but not limited to, serodiagnostic tests. In this regard, conventional approaches have not proven to be reliable for diagnosing and distinguishing infections between similar pathogens, such as flaviviruses. For example, if it is suspected that an individual has been infected with Zika past an acute stage of infection (e.g., 1-2 weeks after exposure), it may be difficult using conventional approaches to distinguish whether the infection was due to Zika or another mosquito-borne virus such as Dengue. The ability to quickly and reliably distinguish between these flaviviruses can be critical to intervene appropriately. Some example embodiments can address this type of biological sensor limitation of conventional solutions by taking advantage of the ability to precisely control temperature at a point/points of interest in a diagnostic platform and leverage the interaction of molecules (e.g., DNA, proteins, etc.), which is governed by thermodynamic principles.

In this regard, according to some example embodiments, microfluidic devices and apparatuses as described herein may operate to distinguish between similarly structured antigens derived from closely related pathogens that interact with the same antibody. This may be performed by varying the temperature of the binding event, which can also be extended for molecular-based detection, to enable the distinction between similar target sequences by varying hybridization temperatures at selected positions.

Figure 10:
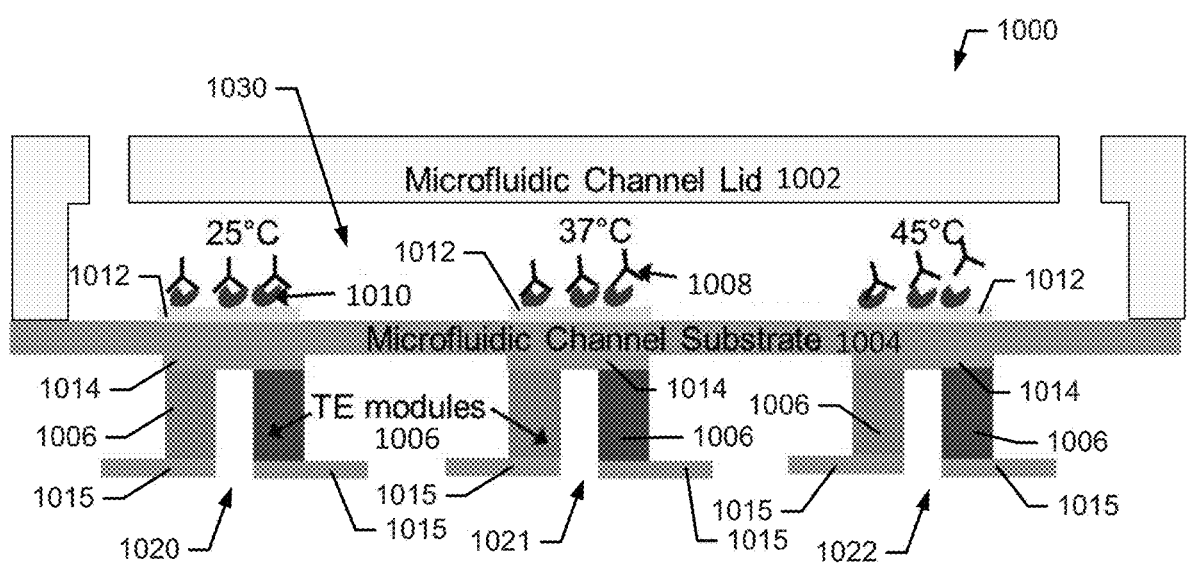
FIG. 10 illustrates another example microfluidic device according to some example embodiments.

An example microfluidic device 1000, according to some example embodiments, is provided in FIG. 10, which may be utilized for such purposes including a sero-diagnostic test. With respect to the structure of the microfluidic device 1000, a microfluidic channel 1030 may be formed by a microfluidic channel substrate 1004 on a bottom side and a microfluidic channel lid 1002 on a top side of the microfluidic channel 1030. Further, three thermal pixels 1020, 1021, and 1022 are provided. Each of the thermal pixels 1020, 1021, and 1022 may be formed by traces 1015 electrically connected to thermoelectric modules or devices 1006. The traces 1015 may be electrically connected to control circuitry, such as the control circuitry 310 described above, which may be configured to control the thermal output of the thermal pixels 1020, 1021, and 1022. Each pair of thermoelectric devices 1006 for a thermal pixel may be electrically connected via a conductor 1014, which may be physically coupled to the microfluidic channel substrate 1004. Within the microfluidic channel 1030, gold pads 1012 may be disposed such that each gold pad 1012 is disposed above a respective thermal pixel 1020, 1021, and 1022.

With respect to the operation of the microfluidic device 1000 within this application, antigens 1010 derived from a pathogen (e.g., Zika or Dengue) may be assembled onto the gold pads 1012 in the microfluidic channel 1030 using established covalent bonding techniques. Following the antigen assembly onto the gold pads 1012, sera from infected individuals or control cohorts may be introduced in the microfluidic channel 1030. Further, the temperature of each thermal pixel 1020, 1021, and 1022 may be controlled at a fixed temperature, for example, 25° C. for pixel 1020, 37° C. for pixel 1021, and 45° C. for pixel 1022. As the temperature increases, the binding efficiency may be reduced for the non-specific antibody-antigen pair (e.g., the binding of Dengue antigen to Zika antibody or the binding of a Zika antigen to a Dengue antibody may be reduced). This binding may be quantified subsequently inside the microfluidic channel 1030, using established enzyme-linked immunosorbent assay (ELISA) techniques. In this regard, according to some example embodiments, control circuitry may be configured to control thermal pixels 1020, 1021, and 1022 to cause antigens of a first structure to adhere to a first localized spot, due to generation of a first temperature at the first localized spot, and antigens of a second structure to adhere to a second localized spot, due to generation of a second temperature at the second localized spot. Accordingly, non-specific binding can be distinguished from specific binding by using the differences in temperature, which can significantly reduce the false-positives in diagnosis, wasted medical treatment, or even mistreatment.

Figure 11:
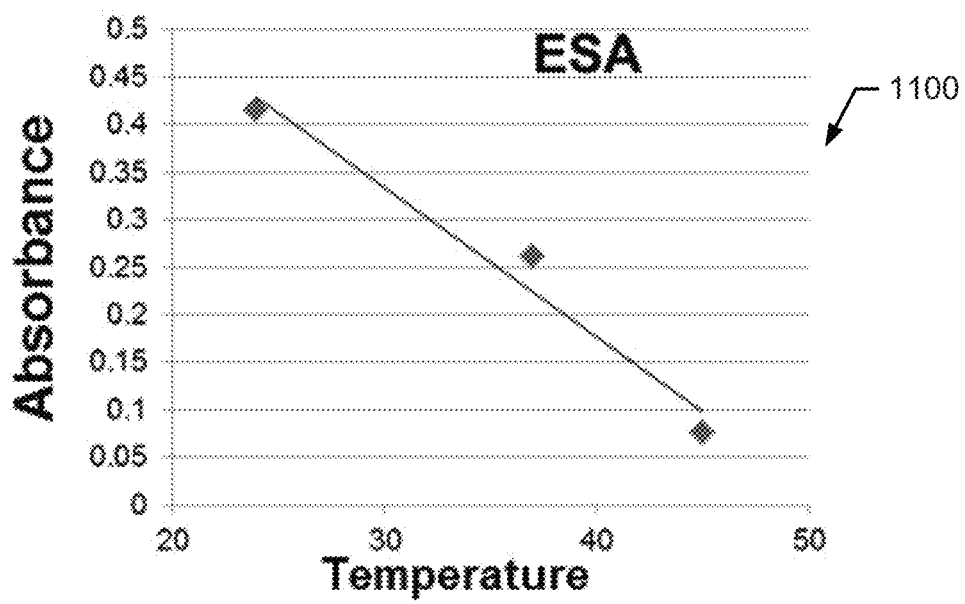
FIG. 11 is a graph of absorbance relative to temperature for Equine Serum Albumin according to some example embodiments.
Figure 12:
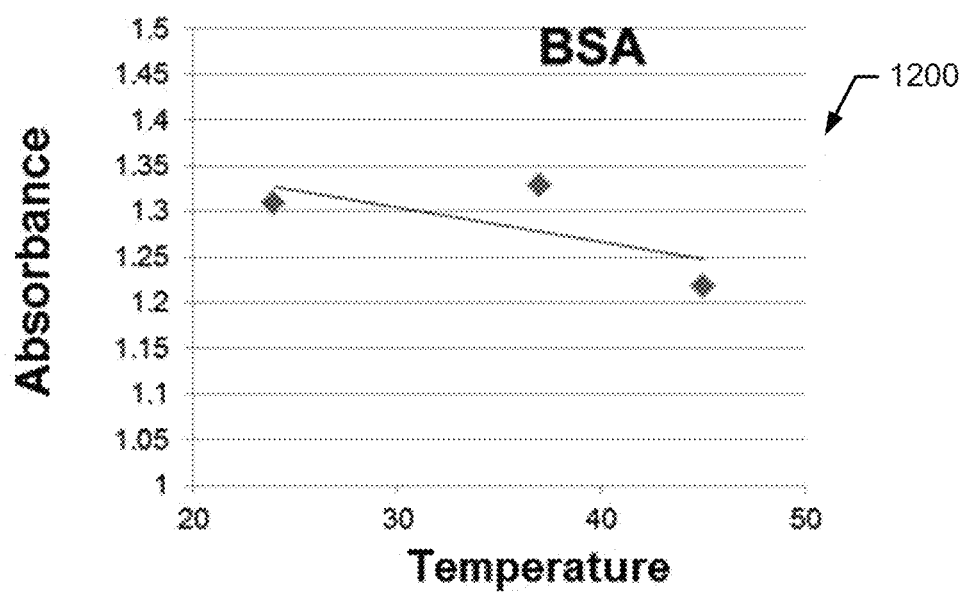
FIG. 12 is a graph of absorbance relative to temperature for Bovine Serum Albumin according to some example embodiments.
Figure 13:
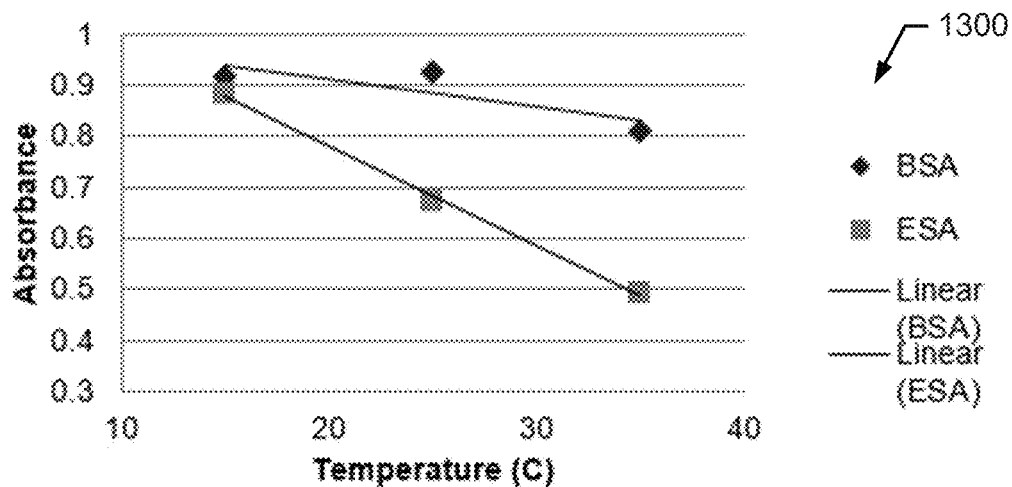
FIG. 13 is another graph of absorbance relative to temperature for Equine Serum Albumin and Bovine Serum Albumin according to some example embodiments.
Figure 14:
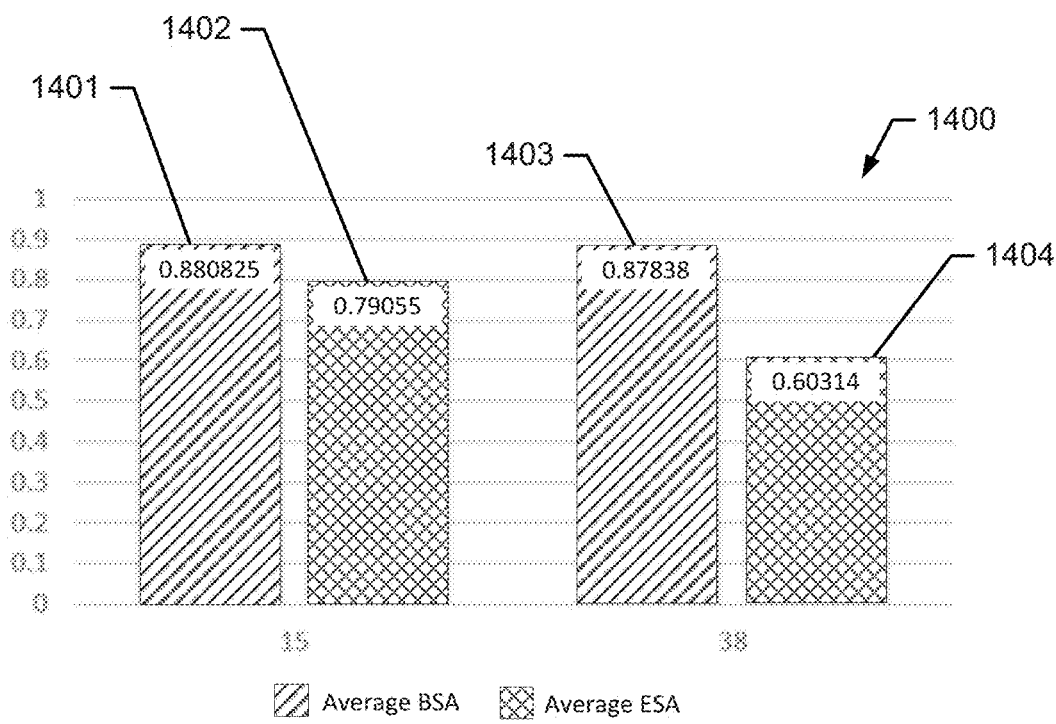
FIG. 14 is a bar graph of average absorbance relative to temperature for Equine Serum Albumin and Bovine Serum Albumin according to some example embodiments.

To test this type of temperature dependence of antibody/antigen binding for cross-reacting analytes using a microfluidic device or apparatus as described herein, two model systems that are known to cross-react may be selected. In this regard, Bovine Serum Albumin (BSA) and Equine Serum Albumin (ESA) may be selected. BSA and ESA proteins may be coated on well plates or input into a microfluidic channel or a similar microfluidic well apparatus, and then tested against anti-BSA antibodies at various temperatures using a microfluidic device or using a standardized well-plates with temperature control provided by an incubator or other similar device as described herein. Binding may be measured optically using, for example, standard ELISA. The results of an actual test are shown in FIG. 11 in graph 1100 and FIG. 12 in graph 1200. It can be seen that for the pair BSA/anti-BSA, the slope of binding is smaller at the 25-45° C. temperature range compared to the cross-reacting ESA/anti-BSA. With additional experimentation, the results shown in FIGS. 13 and 14 were generated. The graphs 1300 of FIG. 13 and 1400 of FIG. 14 were generated using a miniaturized well plate with samples in each well being incubated on a thermal pixel array, such as thermal pixel array 110. As shown in the graph 1300, again, the slope of binding is smaller at the 25-45° C. temperature range for the pair BSA/anti-BSA compared to the cross-reacting ESA/anti-BSA. Also, with respect to graph 1400, it can be seen that at 15° C., the average absorption for BSA is approximately 0.881 at 1401 and the average absorption for ESA is approximately 0.791 at 1402. Additionally, at 38° C., the average absorption for BSA is approximately 0.878 at 1403 and the average absorption for ESA is approximately 0.603 at 1404. As such, a microfluidic device as described herein can be used to generate differential binding slopes for cross-reacting analytes on the same microfluidic chip and provide a rapid, early-detection indication for samples that otherwise require complex laboratory detection techniques.

As such, a microfluidic device as described herein may be transformative due to an ability to quickly diagnose an infection that, using conventional approaches, would otherwise require time consuming and expensive cell culture assays. The process described above may be applicable in multiple implementations, such as by differing numbers of channels where multiple targets are selectively attached, or by attaching antibodies instead of the antigen to detect pathogen specific targets at an acute stage of infection. Further, this thermodynamically controlled binding concept, implementable via various example embodiments, may be expanded to other binding assays such as nucleic acids, which can be used to detect acute infections with minimal requirement of sample manipulation.

Additionally, the microfluidic apparatus 300 may be leveraged to perform analyses involving, for example, various proteins. According to some example embodiments, NS1 proteins, such as Dengue Type 1, Dengue Type 2, Dengue Type 3, and Zika may be used. In this regard, the proteins may be considered with respect to their binding affinity. Binding affinity may be expressed by an equilibrium dissociation constant, $K_d$, which can be used to evaluate and rank order strengths of bimolecular interactions. In this regard, a smaller $K_d$ value can be indicative of a ligand that has a greater binding affinity for a target. The $K_d$ values for the proteins indicated above are provided in TABLE 1, where nM is nanomolar. These proteins are therefore highly cross-reactive with the target antibody, with a largest difference being less than 3-fold (i.e., 3.09 nM for Dengue Type 2 relative to 8.03 nM for Dengue Type 1). This also validates the higher binding efficiency for "matching" an anti-Dengue Type 2/Dengue Type 2 NS1 pair.

TABLE 1

| NS-1 Protein | $K_d$ (nM) |
| --- | --- |
| Dengue Type 1 | 8.03 nM |
| Dengue Type 2 | 3.09 nM |
| Dengue Type 3 | 4.97 nM |
| Zika | 6.37 nM |

Figure 15:
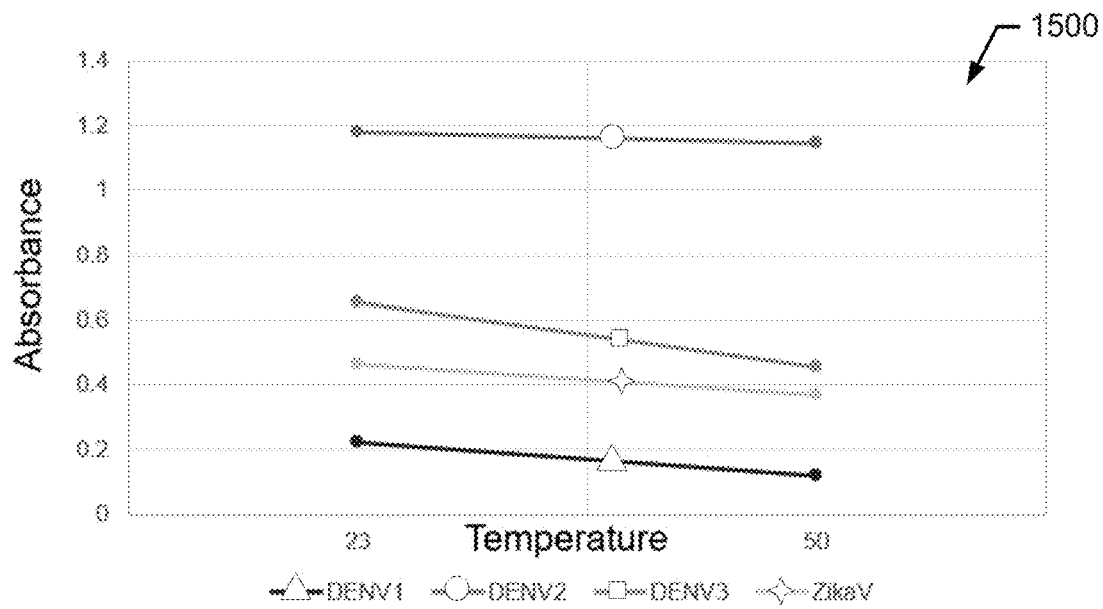
FIGS. 15 and 16 are graphs of absorbance relative to temperature for select proteins according to some example embodiments.

Additionally, with reference to FIG. 15 and graph 1500, it is seen that the proteins have slopes of binding that can be used to reduce cross-reactivity. A characteristic absorbance versus temperature relationship is shown in graph 1500 of FIG. 15 for each of Dengue Type 1, Dengue Type 2, Dengue Type 3, and Zika. Based on a bench-top ELISA approach at two extreme temperatures (i.e., 23° C. and 50° C.) the slope of binding is shown. It can be seen that Dengue Type 2 retains most of its signal or absorbance irrespective of temperature, while the cross-reacting proteins (e.g., Dengue Type 1, Dengue Type 3, and Zika) have a signal or absorbance that changes with temperature.

Figure 16:
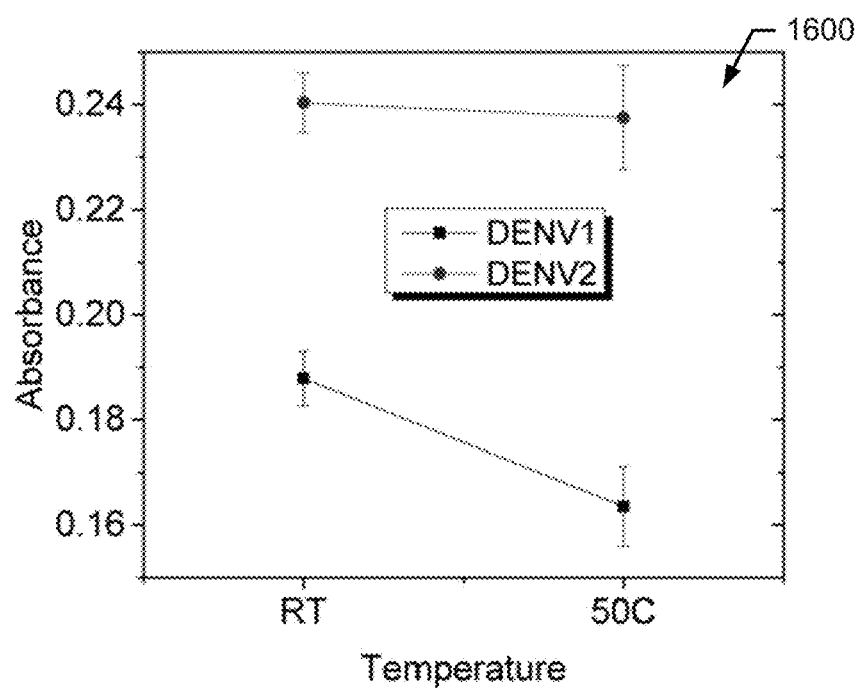

Similar results can be achieved by leveraging, according to some example embodiments, a thermal pixel array, such as thermal pixel array 110, which shows that use of such a thermal pixel array as described herein can lead to breakthroughs and rapid fieldable detection for chemistry and biological detection. As shown in graph 1600 of FIG. 16, an absorbance versus temperature graph is generated from an experiment using a microfluidic apparatus as described herein for each of Dengue Type 1 and Dengue Type 2. As shown in graph 1600, Dengue Type 1 can be readily discriminated from Dengue Type 2, where $K_d$ is less than three. Using a microfluidic apparatus comprising a thermal pixel array, according to some example embodiments, measurements were made at room temperature (RT) and at 50° C. With reference to the graph 1600 of FIG. 16, it can be seen, again, that Dengue Type 2 retains 98.8% of its signal or absorbance irrespective of temperature (i.e., the slope of Dengue Type 2 is small), while the slope of Dengue Type 1 is larger in magnitude indicating that Dengue Type 1 retains 87.1% of its signal or absorbance. According to some example embodiments, if the ELISA process is optimized, then it is expected that even higher margins can be achieved. Based on these analyses, it is shown that the microfluidic apparatus 300 may be leveraged to discriminate between analytes by determining a temperature induced slope with respect to absorbance using thermal pixels set to temperatures that translate to the slope of a selected analyte. Further, rather than relying on an absolute absorbance value to discriminate between analytes, the microfluidic apparatus 300 allows for use of a slope of absorbance with respect to temperature. This may also refer to a slope of binding. The relationship indicates that analytes with a smaller slope are likely to bind, as compared with cross-reacting analytes.

Figure 17:
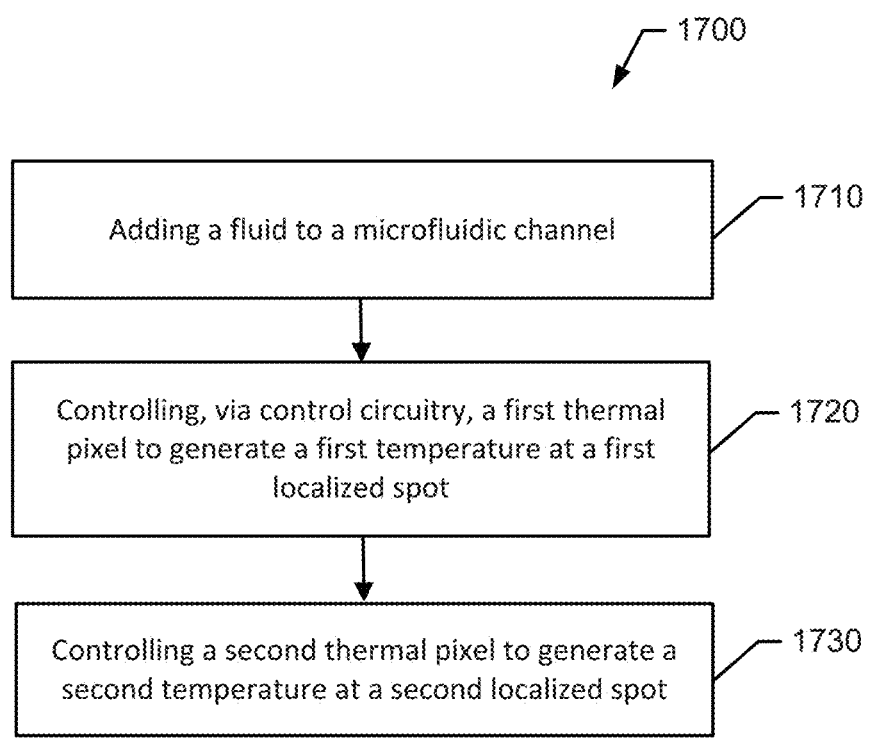
FIG. 17 illustrates a flowchart of an example method for controlling thermal pixels according to an example embodiment.

Based on the forgoing, and according to some example embodiments, an example method may be provided for controlling thermal pixels to perform an analysis as shown in flowchart 1700 of FIG. 17. The example method may be implemented by various hardware including the control circuitry 310 of the apparatus 300.

The example method may include, at 1710, adding a fluid to a microfluidic channel, for example, of a microfluidic apparatus. In this regard, the microfluidic apparatus may be microfluidic apparatus 300 and configured accordingly. The method may further comprise, at 1720, controlling, via the control circuitry, a first thermal pixel to generate a first temperature at a first localized spot, and, at 1730, controlling a second thermal pixel to generate a second temperature at a second localized spot. In this regard, the first temperature may be different than the second temperature. According to some example embodiments, controlling the first thermal pixel may include controlling the first thermal pixel to reduce the first temperature at the first localized spot. Further, controlling the second thermal pixel may include controlling the second thermal pixel to raise the second temperature at the second localized spot to form a temperature gradient within the microfluidic channel between the first localized spot and the second localized spot. According to some example embodiments, controlling the first thermal pixel may include controlling the first thermal pixel to maintain a first temperature at the first localized spot and control the second thermal pixel to raise or lower the second temperature at the second localized spot such that the second temperature is different than the first temperature to form a temperature gradient within the microfluidic channel between the first localized spot and the second localized spot. In this regard, the first localized spot may be adjacent the second localized spot in the microfluidic channel. Additionally, according to some example embodiments, controlling the first thermal pixel may include controlling the first thermal pixel to generate the first temperature at the first localized spot, where the first temperature affects a wettability of a thermoresponsive polymer at the first localized spot. According to some example embodiments, the fluid may include an analyte. Further, according to some example embodiments, the method may also comprise, via imaging captured at the first localized spot, determining an absorbance value for the analyte across a range of temperatures to develop an absorbance slope relative to temperature, and discriminating the analyte based on the absorbance slope.

The embodiments present herein are provided as examples and therefore the associated inventions are not to be limited to the specific embodiments disclosed. Modifications and other embodiments are intended to be included within the scope of the appended claims. Moreover, although the foregoing descriptions and the associated drawings describe example embodiments in the context of certain example combinations of elements and/or functions, different combinations of elements and/or functions may be used to form alternative embodiments. In this regard, for example, different combinations of elements and/or functions other than those explicitly described above are also contemplated. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments.

That which is claimed:

1. A microfluidic apparatus comprising:
a thermoelectrically-activated pixel array comprising a plurality of thermal pixels, each thermal pixel comprising a pair thermoelectric devices, each thermoelectric device comprising a superlattice structure;
a microfluidic chip comprising a microfluidic channel, the microfluidic channel being disposed adjacent to the thermal pixels such that thermal energy generated by the thermal pixels is received by the microfluidic channel to form a plurality of localized spots within the microfluidic channel with each localized spot corresponding to a respective thermal pixel, the plurality of localized spots being visible; and
control circuitry electrically coupled to each of the thermal pixels, the control circuitry being configured to control thermal energy being generated by each thermal pixel to control a temperature at each localized spot within the microfluidic channel, wherein the control circuitry is configured to control a first thermal pixel to generate a first temperature at a first localized spot and control a second thermal pixel to generate a second temperature at a second localized spot, wherein the first temperature is different than the second temperature.

2. The microfluidic apparatus of claim 1, wherein each thermal pixel comprises a solid-state semiconductor device.

3. The microfluidic apparatus of claim 1, wherein each thermal pixel comprises a thin-film thermoelectric device.

4. The microfluidic apparatus of claim 3, wherein each thermal pixel is further configured to be controllable to increase or decrease the temperature at the localized spot corresponding to each thermal pixel.

5. The microfluidic apparatus of claim 1, further comprising a pump configured to generate a fluid flow within the microfluidic channel and through the plurality of localized spots;
wherein the control circuitry is configured to control thermal energy being generated by each thermal pixel while the pump generates the fluid flow.

6. The microfluidic apparatus of claim 5, wherein the first localized spot is adjacent to the second localized spot in the microfluidic channel; and
wherein the control circuitry is configured to, via generation of the first temperature at the first localized spot and generation of the second temperature at the second localized spot, cause and maintain a temperature gradient formed within the fluid flow in the microfluidic channel between the first localized spot and the second localized spot.

7. The microfluidic apparatus of claim 1, wherein each thermal pixel is electrically coupled to the control circuitry via a trace on a substrate, wherein the control circuitry is mechanically coupled to the substrate.

8. The microfluidic apparatus of claim 1, wherein a thermoresponsive polymer is disposed on an interior of the microfluidic channel.

9. The microfluidic apparatus of claim 8, wherein the control circuitry is configured to control the first thermal pixel to generate the first temperature at the first localized spot, wherein the first temperature affects a wettability of the thermoresponsive polymer at the first localized spot.

10. The microfluidic apparatus of claim 1, further comprising a fluid disposed in the microfluidic channel, the fluid comprising sera.

11. The microfluidic apparatus of claim 1, further comprising a fluid disposed in the microfluidic channel, the fluid comprising first antigens having a first structure and second antigens having a second structure; and
wherein the control circuitry is configured to control the first temperature at the first localized spot to cause the first antigens to adhere to the microfluidic channel at the first localized spot, and the control circuitry is configured to control the second temperature at the second localized spot to cause the second antigens to adhere to the microfluidic channel at the second localized spot.

12. The microfluidic apparatus of claim 1, wherein the pair of thermoelectric devices for each thermal pixel are connected in series via a conductor that is in contact with the microfluidic chip;
wherein the control circuitry is configured to apply an electrical bias across the pair of thermoelectric devices and the conductor of each thermal pixel to control the thermal energy output by the thermal pixel.

13. The microfluidic apparatus of claim 1, wherein the superlattice structure of each thermoelectric device comprises a plurality differently doped semiconductor layers of different thicknesses.

14. A system comprising:
an optical sensor configured to capture image data at a microscopic level, the optical sensor being operably coupled to an image data analysis processor configured to analyze the image data captured by the optical sensor to identify particles or attributes of particles presented in the image data; and
microfluidic apparatus comprising:
a thermoelectrically-activated pixel array comprising a plurality of thermal pixels, each thermal pixel comprising a pair of thermoelectric devices, each thermoelectric device comprising a superlattice structure;
a microfluidic chip comprising a microfluidic channel, the microfluidic channel being disposed adjacent to the thermal pixels such that thermal energy generated by the thermal pixels is received by the microfluidic channel to form a plurality of localized spots within the microfluidic channel with each localized spot corresponding to a respective thermal pixel; and
control circuitry electrically coupled to each of the thermal pixels, the control circuitry being configured to control thermal energy being generated by each thermal pixel to control a temperature at each localized spot within the microfluidic channel, wherein the control circuitry is configured to control a first thermal pixel to generate a first temperature at a first localized spot and control a second thermal pixel to generate a second temperature at a second localized spot, wherein the first temperature is different than the second temperature; and
wherein the optical sensor is configured to capture image data at the first localized spot and the second localized spot to identify particles or attributes of particles presented in the image data at the first localized spot and the second localized spot.

15. The system of claim 14, wherein each thermal pixel comprises a thin-film thermoelectric device, and wherein each thermal pixel is further configured to be controllable to increase or decrease the temperature at the localized spot corresponding to each thermal pixel.

16. The system of claim 14, wherein the first localized spot is adjacent to the second localized spot in the microfluidic channel; and
wherein the control circuitry is configured to control the first thermal pixel to reduce the first temperature at the first localized spot and control the second thermal pixel to raise the second temperature at the second localized spot to form a temperature gradient within the microfluidic channel between the first localized spot and the second localized spot.

17. The system of claim 14, wherein a thermoresponsive polymer is disposed on an interior of the microfluidic channel; and
wherein the control circuitry is configured to control the first thermal pixel to generate the first temperature at the first localized spot, wherein the first temperature affects a wettability of the thermoresponsive polymer at the first localized spot.

* * * * *